(12) United States Patent
Pieraerts et al.

(10) Patent No.: US 8,963,314 B2
(45) Date of Patent: Feb. 24, 2015

(54) PACKAGED SEMICONDUCTOR PRODUCT AND METHOD FOR MANUFACTURE THEREOF

(75) Inventors: Eric Pieraerts, St. Lontest (FR); Jean-Marc Yannou, Colomby sur Thaon (FR); Stephane Bellenger, Fleury-sur-Orng (FR); Mickael Pommier, Anguerny (FR)

(73) Assignee: NXP B.V., Eindhoven (NL)

( * ) Notice: Subject to any disclaimer, the term of this patent is extended or adjusted under 35 U.S.C. 154(b) by 621 days.

(21) Appl. No.: 13/001,391

(22) PCT Filed: Jun. 26, 2009

(86) PCT No.: PCT/IB2009/052773
§ 371 (c)(1),
(2), (4) Date: Apr. 11, 2011

(87) PCT Pub. No.: WO2009/156970
PCT Pub. Date: Dec. 30, 2009

(65) Prior Publication Data
US 2011/0180897 A1   Jul. 28, 2011

(30) Foreign Application Priority Data

Jun. 26, 2008 (EP) .................................. 08290622
Jun. 26, 2009 (EP) .................................. 09769778

(51) Int. Cl.
*H01L 23/48* (2006.01)
*H01L 23/31* (2006.01)
(Continued)

(52) U.S. Cl.
CPC .......... *H01L 23/3107* (2013.01); *H01L 21/561* (2013.01); *H01L 21/568* (2013.01); *H01L 23/3114* (2013.01); *H01L 23/3171* (2013.01);
(Continued)

(58) Field of Classification Search
USPC .......................... 257/688, 528, 698, 723, 787
See application file for complete search history.

(56) References Cited

U.S. PATENT DOCUMENTS

| 4,249,299 A | 2/1981 | Rill et al. |
| 5,394,303 A | 2/1995 | Yamaji |
| 5,497,033 A | 3/1996 | Fillion et al. |
| 6,049,124 A * | 4/2000 | Raiser et al. .................. 257/712 |
| 6,147,398 A | 11/2000 | Nakazato et al. |
| 6,329,708 B1 | 12/2001 | Komiyama |

(Continued)

FOREIGN PATENT DOCUMENTS

WO   2005/076794 A2   8/2005

OTHER PUBLICATIONS

International Search Report and Written Opinion for Application PCT/IB2009/052773 (Oct. 7, 2009).

*Primary Examiner* — Eugene Lee

(57) ABSTRACT

Packaged semiconductor product (2) including a first semiconductor device (4A) and a packaging structure with a protective envelope (6) and a first and second external electrode (8,10). The first semiconductor device (4A) has a first substrate (11A) and is provided with a first passivation layer (12A) and a first electronic structure. The first substrate has a first main surface (14). The first substrate (11A) is embedded in the protective envelope (6) and the first main surface (14) faces a first opening (23) of the protective envelope (6). The first electronic structure has a first and a second contact region (20, 22) for electrically contacting the first electronic structure. The first passivation layer (12A) substantially covers the first main surface (14) and the first electronic structure. The protective envelope (6) extends between the first passivation layer (12A) and the first external electrode (8) towards the first contact region (20).

17 Claims, 6 Drawing Sheets

(51) Int. Cl.
*H01L 21/56* (2006.01)
*H01L 23/00* (2006.01)

(52) U.S. Cl.
CPC ............ *H01L 23/3185* (2013.01); *H01L 24/19* (2013.01); *H01L 2224/04105* (2013.01); *H01L 2224/20* (2013.01); *H01L 2924/01013* (2013.01); *H01L 2924/01015* (2013.01); *H01L 2924/01029* (2013.01); *H01L 2924/01033* (2013.01); *H01L 2924/01079* (2013.01); *H01L 2924/01082* (2013.01); *H01L 2924/14* (2013.01); *H01L 2924/19041* (2013.01); *H01L 2924/01005* (2013.01); *H01L 2924/01006* (2013.01); *H01L 2924/014* (2013.01)
USPC ........... 257/688; 257/528; 257/698; 257/723; 257/787

(56) References Cited

U.S. PATENT DOCUMENTS

| | | | | |
|---|---|---|---|---|
| 6,603,191 | B2 * | 8/2003 | Wakabayashi et al. | 257/620 |
| 6,979,593 | B2 * | 12/2005 | Kawakami | 438/110 |
| 7,022,552 | B2 * | 4/2006 | Yamaguchi | 438/113 |
| 7,037,759 | B2 * | 5/2006 | Tao | 438/113 |
| 7,208,335 | B2 * | 4/2007 | Boon et al. | 438/33 |
| 7,224,045 | B2 * | 5/2007 | Tabira et al. | 257/666 |
| 7,530,163 | B2 * | 5/2009 | Sunohara et al. | 29/832 |
| 7,665,201 | B2 * | 2/2010 | Sjoedin | 29/592.1 |
| 7,728,419 | B2 * | 6/2010 | Lee et al. | 257/690 |
| 7,790,506 | B2 * | 9/2010 | Fukuda | 438/113 |
| 8,373,202 | B2 * | 2/2013 | Lin et al. | 257/211 |
| 2004/0142509 | A1 | 7/2004 | Imai | |

* cited by examiner

PACKAGED SEMICONDUCTOR PRODUCT AND METHOD FOR MANUFACTURE THEREOF

FIELD OF THE INVENTION

The invention relates to a packaged semiconductor product including a first semiconductor device and a packaging structure with a protective envelope and a first and a second external electrode, the first semiconductor device having a first substrate and being provided with a first passivation layer and a first electronic structure, wherein the first substrate is embedded in the protective envelope and has a first main surface that faces a first opening of the protective envelope, the first electronic structure being integrated with the first substrate along the first main surface and having a first and a second contact region, wherein the first passivation layer substantially covers the first main surface and the first electronic structure and leaves free the first and second contact region, wherein the first external electrode is electrically coupled to, and preferably directly contacts the first contact region and the second external electrode is electrically coupled to the second contact region. By being embedded in the protective envelope, the first substrate is partly encapsulated by the protective envelope.

The invention also relates to an electric product including a packaged semiconductor product according to the invention.

The invention further relates to a method for manufacture of a packaged semiconductor product that includes a first semiconductor device and a packaging structure with a protective envelope and a first and second external electrode, the first semiconductor device having a first substrate that has a first main surface, including the steps of: a) integrating a first electronic structure with the first substrate along the first main surface, the first electronic structure having a first and a second contact region for electrically contacting the first electronic structure; b) providing the first substrate with a first passivation layer, which substantially covers the first main surface and the first electronic structure and leaves free the first and second contact region; c) placing the first semiconductor device on a carrier.

Semiconductor devices provided with one or more integrated passive functions have steadily increased their levels of integration density. As a result, these devices have become commercially competitive and offer the differentiating advantage of allowing for the custom integration of different electrical components while offering a wide range of values of characteristic parameters of these electrical components. However, semiconductor devices are provided with a semiconductor substrate, such as silicon, that is not a perfect electrical isolator.

A passivation layer in an integrated circuit generally aims to prevent both corrosion and electrical disturbance from outside the integrated circuit. Thereto, the passivation layer is conventionally a sufficiently thick layer of a dense modification of silicon nitride, that extends on the complete integrated circuit, except at the locations of the bond pads. The side faces of the integrated circuit are usually protected by the protective envelope, which envelope also embeds wirebonds extending from the bond pads to a package substrate. In so-called chip scale packages, such protective envelope is even left out completely.

However, both the miniaturization of semiconductor devices and space limitations of a customer's products, such as today's and tomorrow's ultrathin mobile phones, require new packaging concepts. One of such concepts is the provision of integrated circuits (i.e. chips) in the printed circuit board, just as passive discretes are embedded in the printed circuit board. Another concept is the generation of a fan-out wafer level package. This type of package would allow that the package has a somewhat larger surface area than the chip to provide sufficient space for all terminals, while nevertheless no separated package carrier is needed—which makes particularly ball grid arrays relatively expensive. It is different from traditional packages in that a contact electrode may extend laterally over the side face of the chip—which side face is more particularly constituted by an interface between the chip and the protective envelope. A particular version hereof would make use of U-shaped contacts that are typically applied in discrete passive components, also simply referred to as SMDs. Packaged semiconductor devices with U-shaped contacts have inter alia the advantages that they may be assembled corresponding to SMDs and that there is no need to distinguish bottom and top side of the device during board assembly. The conversion of particularly the small chips with a limited number of contact electrodes into SMD-type packages is thus desired.

In the course of investigations leading to the invention, it has been found that the fan-out packaged semiconductor devices turned out less resistant against the generation of electrical shorts than semiconductor devices that had been provided with a more traditional package. Particularly, the resistance was found insufficient for shorts in case of high voltage pulses, such as may occur in ESD-events.

It is therefore an object of the invention to provide a packaged semiconductor product with improved resistance against electrical shorts.

Accordingly, the invention provides a packaged semiconductor product wherein the protective envelope extends between the first passivation layer and the first external electrode towards the first contact region. Thus, in other words, the protective envelope is not merely present adjacent to a side face of the chip, but also on top of the passivation layer (when the chip is positioned with the passivation layer on its top side), but below the first external electrode. In this way, a probability of the first passivation layer to develop one or more cracks, for example near a boundary of the first passivation layer, may be reduced. Such cracks were found to be a cause of said reduced resistance, as they allow a direct path from the external electrode into the semiconductor substrate. A specific location for the crack was found to be at the interface, and furthermore between the passivation layer and the semiconductor substrate. Such cracks can also exist before application of the protective envelope. They can for example result from a sawing process in order to separate the first semiconductor devices from a semiconductor wafer. In case these latter cracks are present, further extension or opening of these cracks may be hindered by the presence of the protective envelope. In addition, the protective envelope, especially when electrically isolating, helps preventing unwanted direct electrical contact of the external electrodes with the first substrate of the first semiconductor device. Such unwanted direct contact can for example be caused by material of the external electrodes that flowed into the cracks during use of the packaged semiconductor product, but can also occur during application of the first external electrode when manufacturing the packaged semiconductor product. As a result, a risk of unwanted shorts between the first external electrode and the first substrate is reduced. The protective envelope extending between the first passivation layer and the first external electrode towards the first contact region improves reliability of the packaged semiconductor product, in particular for applications that require high currents through the first external electrode and/or a high voltage difference between the first external electrode and the first substrate, such as in electrostatic discharge (ESD) protection. The protective envelope effectively forms an additional electrically isolating barrier between the first and second external electrode on the one hand and regions of the first substrate that are not intended to be in direct electrical contact with the first and second external electrode on the other hand, but can also improve the quality of electro-magnetic interference (EMI) filters. An important aspect herein is that the protective envelope preferably comprises a material with a higher elasticity than the semiconductor substrate and the passivation layer. It is therewith a additional barrier that behaves differently from the passivation layer, leading to improved performance.

More specifically, the protective envelope has a surface facing away from the passivation layer and being at least partially covered by the first external electrode. This surface terminates on the passivation layer. Preferably, this surface has a contact angle with the (top side of the) passivation layer that is smaller than 90 degrees, and preferably smaller than 45 degrees. Such small contact angle will be achieved if (partial) wetting of the passivation layer occurs on application of the protective envelope. As is known in the field of physical chemistry, wetting behaviour depends on solvent and molecular interaction of the envelope with the passivation layer. Suitable choices and surface treatments may support the desired effect. Specifically, the contact region, and suitably a portion of the passivation layer circumfering the contact region, is provided with a surface structure or surface treatment or temporary coverage such that the protecting envelope does not extend on the contact region.

BACKGROUND OF THE INVENTION

In an embodiment, the external electrodes are U-shaped. More specifically said, the first substrate further has a second main surface opposite to the first main surface, and a first side surface that extends from the first main surface to the second main surface, wherein the protective envelope extends along the second main surface and/or the first side surface, wherein the first external electrode covers a part of the protective envelope adjacent to at least one of the first main surface, the second main surface, and/or the first side surface. In this way, for example in case the first and second external electrode cover the part of the protective envelope adjacent to both the first main surface and the second main surface, the packaged semiconductor product can be mounted to a surface, for example a surface of a printed circuit board, irrespective whether the electronic structure faces towards or away from the surface of the printed circuit board. In addition, such a packaged semiconductor product can have a thickness, measured in a direction transverse to the first and second main surface, of at most 150 micrometer, or even of at most 100 micrometer. Such a small thickness of the packaged semiconductor product can advantageously reduce weight and size of an electric product that includes the packaged semiconductor product.

In an embodiment, a recess is present in the semiconductor substrate adjacent to an edge of the first side surface and the first main surface. Suitably, such recess is present at an edge with a further, second side surface, i.e. in a corner of the packaged device. However, it is not excluded that such recess extends over a larger portion, up to constituting a groove along the complete first side surface. In this embodiment, a probability of damage, such as delamination of the protective envelope from the first substrate, is reduced. By filling the recess, the protective envelope can engage on the recess. In practice, delamination might occur during a production process of the first semiconductor device, but might also occur during use of the first semiconductor device, in particular during use in harsh circumstances, for example with large temperature fluctuations leading to thermo-mechanical stress and/or with high mechanical loading such as mechanical shocks. Such delamination can lead to direct electrical contact between the first and/or second external electrode and the first substrate. By preventing delamination during manufacturing according to the invention, a yield of manufacturing can be improved.

More specifically, the recess is provided with a recess surface with encloses an angle with both the first side surface and the first main surface in a range between 45 and 135 degrees, more preferably between 60 and 120 degrees, and even more preferably between 75 and 105 degrees. In this manner, adequate engagement between the protective envelope and the first substrate is enabled. Preferably, the recess surface is rounded. Both the angles and the surface shape allow the recess to be generated by punching, lasering and/or etching.

The protective envelope extending along the passivation layer and/or engaging on the recess both offer the significant advantage of an increased robustness of the packaged semiconductor product against mechanical shocks, and against damage from thermomechanical stress as a result of, possibly repeated, variation in temperature of the packaged semiconductor product. This is achieved by the protective envelope engaging, for example gripping, on the recess and/or on the first main surface.

In an embodiment, a boundary of the first passivation layer substantially extends up to a boundary of the first main surface. This has the advantage that a lot of the first semiconductor devices, included by a semiconductor wafer, can be provided with the first passivation layer in one blanket deposition step. In an alternative embodiment, the boundary of the first passivation layer does not extend completely up to the boundary of the first main surface. In this case, a probability of developing cracks in the first passivation layer near the boundary of the first main surface, as a result of a separation process, such as sawing, of the first semiconductor devices from the semiconductor wafer, is reduced.

In an embodiment, the first substrate has first additional side surfaces that extend from the first main surface to the second main surface, and the protective envelope extends along the second main surface, the first side surface, and the first additional side surfaces, wherein the first external electrode covers the part of the protective envelope adjacent to the first main surface, the second main surface, and the first side surface. In particular, the second external electrode covers the part of the protective envelope adjacent to the first main surface, the second main surface, and at least one of the first additional side surfaces. This offers a practical version of the packaged semiconductor product according to the invention.

In an embodiment, the packaged semiconductor product includes a second semiconductor device having a second substrate and being provided with a second passivation layer and a second electronic structure, wherein the second substrate is embedded in the protective envelope and has a third main surface that faces a second opening of the protective envelope, the second electronic structure being integrated with the second substrate along the third main surface and having a third and a fourth contact region, wherein the second passivation layer substantially covers the third main surface and the second electronic structure and leaves free the third and fourth contact region, wherein the second external electrode is electrically coupled to the fourth contact region and is electrically connected to the second contact region via the fourth contact region, the second electronic structure, the third contact region, and a conducting structure from the third contact region to the second contact region, wherein the protective envelope forms an electrically isolating structure between the first substrate and the second substrate. In this way good electrical isolation between the first and second substrate can be achieved outside the conducting structure. This is important for example when the first and second semiconductor device form a cascade of electrically connected diode pairs and these diode pairs need to be electrically isolated from each other outside the conducting structure, as can for example be required in ESD protection with high voltage triggering.

In an embodiment, an electrically isolating layer portion extends between the conducting structure and the first and/or second passivation layer. In this way, a probability of electrical shorts from the conducting structure through respectively the first and/or second substrate is further reduced. The isolating layer portion can improve electrical isolation of the conducting structure.

In an embodiment, the isolating layer portion is arranged to extend between substantially all of the conducting structure and the first substrate and/or between substantially all of the conducting structure and the second substrate. In this way, direct contact between the conducting structure and the first and second passivation layer is substantially prevented. In particular, this offers a way of connecting the first and second semiconductor device. In a similar way, a third semiconductor device can be connected to the second semiconductor device, a fourth semiconductor device can be connected to the third semiconductor device, and so on. In case each semiconductor device includes a diode, such a cascade of semiconductor devices may for example increase a triggering voltage of a semiconductor device for ESD protection.

In an embodiment, at least part of the isolating layer portion is formed by an extension of the protective envelope that extends between the first passivation layer and the conducting structure towards the second contact region and that possibly extends between the second passivation layer and the conducting structure towards the third contact region. This increases the symmetry of the packaged semiconductor product and consequently facilitates a production process of the packaged semiconductor product.

In an embodiment, the packaged semiconductor product includes at least one of a passive component, a structure for combined passive functions, and an integrated circuit structure. In particular, the semiconductor product includes only one passive component, such as a resistor, an inductor, a capacitor or a diode.

In an embodiment, the packaged semiconductor product includes at least one of a back-to-back pair of Zener diodes and a back-to-back pair of Avalanche diodes.

In an embodiment, the packaged semiconductor product is manufactured in a first production environment, for example an integrated circuit foundry environment or wafer fab, and the protective envelope, the optional conducting structure and/or the isolating layer portion are applied in a second production environment that may be related to the first production environment, for example a post-processing zone in a wafer fab. This embodiment has the advantage that it combines well with emerging packaging techniques, such as redistributive chip packaging or embedded wafer level packaging. Such a process flow is different from a conventional process flow, wherein packaging is performed outside the first production environment, for example in a chip assembly environment where conditions are less clean compared to the first and second production environment.

The invention also provides an electric product including a packaged semiconductor product according to the invention. Such a product can for example be a mobile phone, a computer such as a lap top computer, an MP3-player, or a television or monitor, for example provided with a liquid crystal display or a cathode ray tube. In particular, the dimensions of the packaged semiconductor product are important for an electric product according to the invention, as is for example the case in an electric product for medical use, in a wireless electric product, and in a portable electric product.

It is another object of the invention to provide a method for manufacture of a packaged semiconductor product with improved protection against coating failure.

Accordingly, the invention provides a method that includes the steps of: d) moulding the protective envelope around the first semiconductor device, so that the first substrate is embedded in the protective envelope and the first main surface faces a first opening of the protective envelope, and further moulding the protective envelope along a part of the first passivation layer; and e) applying the first and second external electrode with the first external electrode coupled to, and preferably in direct electrical contact with the first contact region and the second external electrode electrically coupled to the second contact region.

In an embodiment, step d) includes curing the protective envelope. Curing may include heating the protective envelope.

In an embodiment, step c) includes placing the first semiconductor device on a carrier with the first passivation layer facing the carrier, and step d) includes moulding the protective envelope around the first semiconductor device along the part of the first passivation layer by partly filling a space between the first passivation layer and the carrier. This is an efficient and well-controlled way of obtaining an extension of the protective envelope that extends between the first passivation layer and first external electrode. Partly filling the space may be performed under compression and by using a flexible carrier, so that the space becomes filled by underfilling the first semiconductor device.

In an embodiment, the method includes carrying out the steps a)-e) for a plurality of first semiconductor devices, wherein the carrier is common for the plurality of first semiconductor devices and the protective envelopes of the plurality of first semiconductor devices are formed by a common moulded structure, wherein a moulded wafer is obtained after steps a)-d) and possibly after step e) that includes the plurality of first semiconductor devices and the common moulded structure, including the step of: f) dividing the moulded wafer into separate packaged semiconductor products, each packaged semiconductor product including one or more semiconductor devices of the plurality of first semiconductor devices. Such a method offers an efficient way of manufacturing the plurality of packaged semiconductor products, wherein process steps, which are for example related to handling, deposition, or patterning, can be carried out for the plurality of the semiconductor devices at the same time. The moulded wafer may be obtained after step e) for example in case the first and second external electrode are part of a redistribution layer, that is deposited before step f) is carried out. The moulded wafer may be obtained before step e) for example in case the first electrode is deposited on the protective envelope along the first side surface.

In an embodiment, the method includes separating the first semiconductor device from a semiconductor wafer by sawing using a saw with a first thickness creating a notch in the semiconductor wafer and sawing along the notch using a saw with a second thickness that is smaller than the first thickness, thus obtaining a second side surface of the first substrate that extends from the first main surface, which first side surface is provided with a recess adjacent to an edge of the second side surface and the first main surface. Preferable, the recess extends at the edge of the second side surface and the first main surface. This is an efficient way of obtaining the recess, as sawing equipment for sawing the wafer usually is readily available. By filling the recess, the protective envelope engages on the recess, hindering the occurrence of delamination between the protective envelope and the first substrate and reducing a probability of occurrence of shorts from the first external electrode to the first substrate or vice versa.

BRIEF DESCRIPTION OF THE DRAWINGS

The invention will now be described, in a non-limiting way, with reference to the accompanying drawing, in which.

DETAILED DESCRIPTION OF THE EMBODIMENTS

Unless stated otherwise, the same reference numbers will refer to like components throughout the drawings.

Figure 1A:
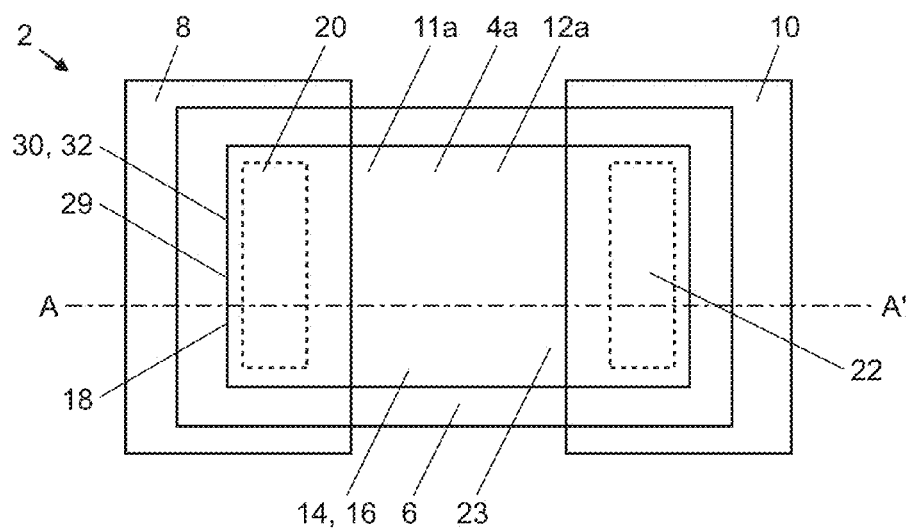
FIG. 1A shows a transparent top view of a packaged semiconductor product in a first embodiment according to the invention.
Figure 1B:
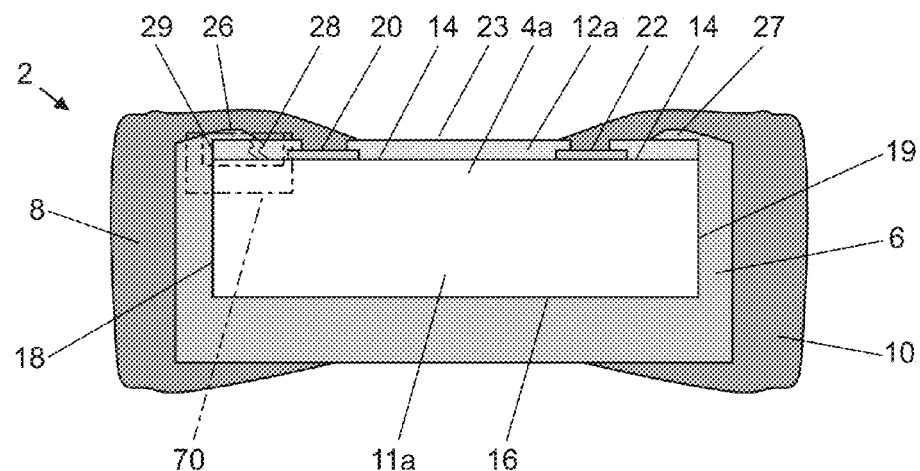
FIG. 1B shows a cross section along line A-A' in FIG. 1A.
Figure 4A:
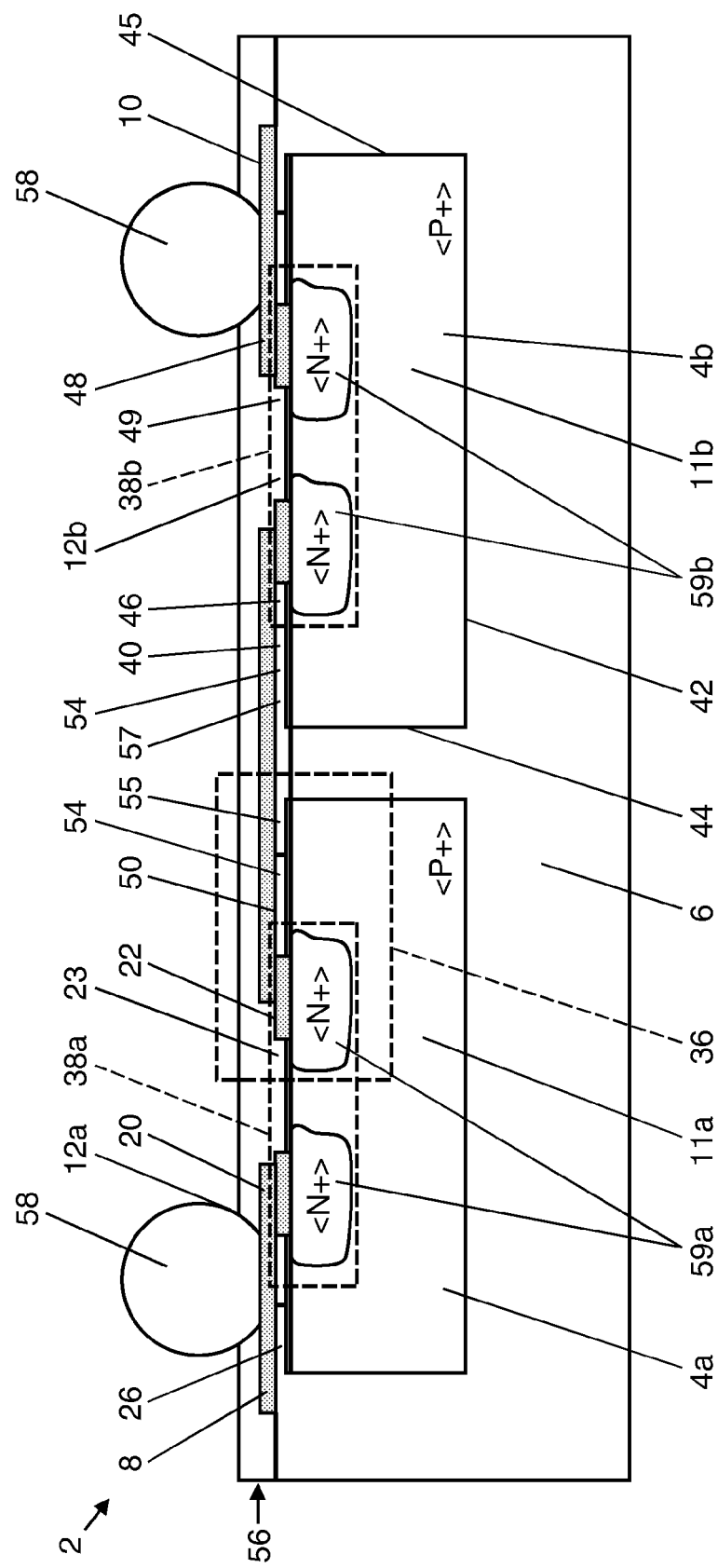
FIG. 4A shows a cross section of a packaged semiconductor product in a third embodiment according to the invention.

FIG. 1A shows a transparent top view of a packaged semiconductor product 2 in a first embodiment according to the invention, and FIG. 1B shows a cross section along line A-A' in FIG. 1A. The packaged semiconductor product 2 includes a first semiconductor device 4A, a protective envelope 6, a first external electrode 8 and a second external electrode 10. The protective envelope 6, the first external electrode 8, and the second external electrode 10 are included by a packaging structure of the packaged semiconductor product 2. The first semiconductor device 4A has a first substrate 11A and is provided with a first passivation layer 12A and a first electronic structure, in this example a first passive component (not shown in FIG. 1A, although an example of the first passive component is shown in FIG. 4A with reference number 38A). The first electronic structure is integrated with the first substrate along the first main surface and has a first and a second contact region 20, 22. Such integration in general includes that material of the first substrate may be part of the first electronic structure. The first substrate 11A has a first main surface 14 and may have a second main surface 16 opposite to the first main surface 14. The first substrate 11A may further have a first side surface 18 and first additional side surfaces 19, which extend from the first main surface 14 to the second main surface 16. The first substrate 11A may have substantially the shape of a rectangular box.

In general, the first electronic structure may include a passive component such as a capacitor, an inductor, and/or a resistor, the first electronic structure may include a structure for combined passive functions such as electro-magnetic interference (EMI) filters, transformers, and electro-static discharge (ESD) protection Avalanche and Zener diodes, and/or the first electronic structure may include an integrated circuit structure.

The first passive component is located along the first main surface 14 and has the first contact region 20 and the second contact region 22 for electrically contacting the first passive component. The first passivation layer 12A substantially covers the first main surface 14 and the first passive component and leaves free the first and second contact regions 20, 22, so that these can be contacted.

The protective envelope 6 may extend along the second main surface 16, the first side surface 18 and the first additional side surfaces 19 of the first substrate 11A, and may be closely mechanically connected therewith. Hence, the first substrate 11A is embedded in the protective envelope 6. The first main surface 14 faces a first opening 23 of the protective envelope 6.

The first external electrode 8 directly contacts the first contact region 20. The second external electrode 10 is electrically coupled to the second contact region 22, for example via a first electrically conductive path outside the first passive component. In the first embodiment, this is established by direct contact of the second external electrode 10 with the second contact region 22.

In the first embodiment, the first and second external electrode 8, 10 cover a part of the protective envelope adjacent to at least one of the first main surface 14, the second main surface 16, and/or the first side surface 18. For example, the first external electrode 8 extends adjacent to the second main surface 16 when the protective envelope 6 is arranged in between the second main surface 16 and the first external electrode 8. If the first external electrode 8 also extends adjacent to the first main surface 14 and if the second external electrode 10 also extends adjacent to the first main surface 14 and the second main surface 16, this has the advantage that the packaged semiconductor product 2 can be mounted to a printed circuit board in either one of two different orientations: one orientation with the first passivation layer 12A facing the printed circuit board, and one orientation with the first passivation layer 12A facing away from the printed circuit board. In case the first and second external electrode 8, 10 extend adjacent to the first side surface 18, a good electrical isolation is still maintained by the protective envelope 6 in between the first and second external electrode 8, 10 and the first substrate 11A.

In general, the first and/or second external electrode 8, 10 may extend adjacent to the first main surface 14, the second main surface 16, and/or the first side surface 18 of the first substrate 11A.

In the first embodiment, the protective envelope 6 extends between the first passivation layer 12A and the first external electrode 8 towards the first contact region 20. In this way a first extension 26 of the protective envelope 6 is formed that extends between the first passivation layer 12A and the first external electrode 8 towards the first contact region 20. In general, the protective envelope 6 may form an electrically isolating barrier between the first external electrode 8 on the one hand and the first passivation layer 12A and the first main surface 14 of the first substrate 11A on the other hand. In the first embodiment, the protective envelope 6 forms an electrically isolating barrier between the first external electrode 8 on the one hand and the second main surface 16, the first side surface 18 and the first additional side surfaces 19 of the first substrate 11A on the other hand.

In addition, the protective envelope 6 in the first embodiment further extends between the first passivation layer 12A and the second external electrode 10 towards the second contact region 22. In this way a second extension 27 of the protective envelope 6 may be formed between the first passivation layer 12A and the second external electrode 10 towards the second contact region 22. The first extension 26 of the protective envelope 6 reduces a probability of the first passivation layer to develop one or more cracks 28. In addition, in case such cracks are present, the first extension 26 and the second extension 27 of the protective envelope 6 substantially prevent direct electrical contact of respectively the first external electrode 8 and the second external electrode 10 with a first substrate 11A of the semiconductor device 4A. This gives the protective envelope 6 additional functionality compared to traditional functionalities of the protective envelope, such as protecting the first semiconductor device 4A against moisture from an environment of the packaged semiconductor product 2. The first and second extension 26, 27 of the protective envelope 6 can define a size of the first opening 23.

Hence, it will be appreciated that in general the protective envelope 6 may fold around a first edge 29 of the first main surface 14 and the first side surface 18 onto the first passivation layer 12A. In general, the protective envelope 6 may extend between the first external electrode 8 and the first passivation layer 12A along a surface of the first passivation layer 12A that faces the first external electrode 8 and that is adjacent to the first edge 29 of the first main surface 14 and the first side surface 18.

In the packaged semiconductor product 2 in the first embodiment, a boundary 30 of the first passivation layer 12A may substantially extend up to a boundary 32 of the first main surface 14. The boundary 32 of the first main surface may include the first edge 29 of the first main surface 14 and the first side surface 18.

Figure 2:
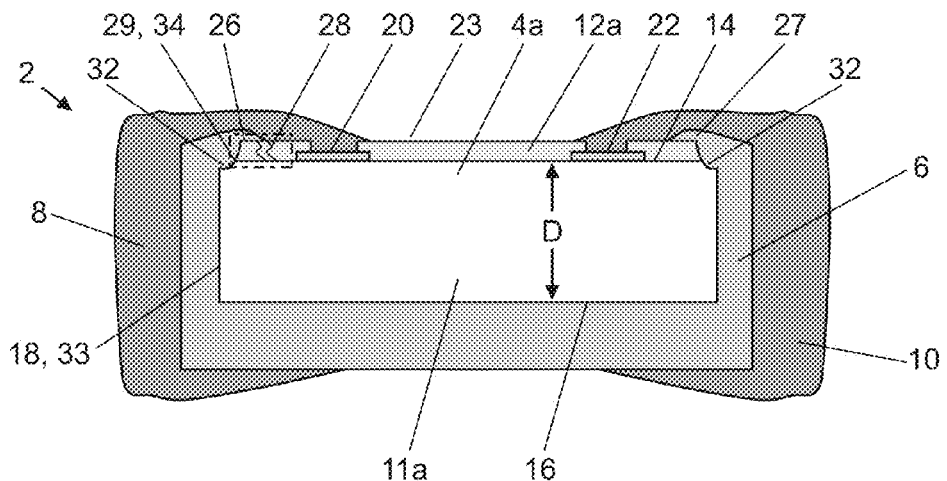
FIG. 2 shows a cross section of a packaged semiconductor product in a second embodiment according to the invention.

FIG. 2 shows a cross section of the packaged semiconductor product 2 in a second embodiment according to the invention. In the second embodiment, a recess 32 is provided in the first main surface 14 of the semiconductor substrate 11A adjacent to the first side surface 18. The recess 32 has a surface that extends between a first edge 29 with the main surface 14 and a second edge 34 with the first side surface 18. In this embodiment, the angles at the first and the second edges 29, 34 are approximately 90 degrees. In this embodiment, the recess 32 extends into the passivation layer 12A, i.e. it is made into the device after application of the passivation layer using a punching or lasering type of process. However, it is not excluded that the recess 32 is provided only in the semiconductor substrate 11A, while a corresponding aperture in the passivation layer 12A is made in line with and in the same step as the bond pad openings that provide access to the contact regions 20, 22. The protective envelope 6 extends along the first side surface 18. The recess 32 may extend as a groove along the length of the first side surface 18. Alternatively, the recess is present at an intersection between the first side surface 18 and a further, second side surface (not shown).

Figure 3:
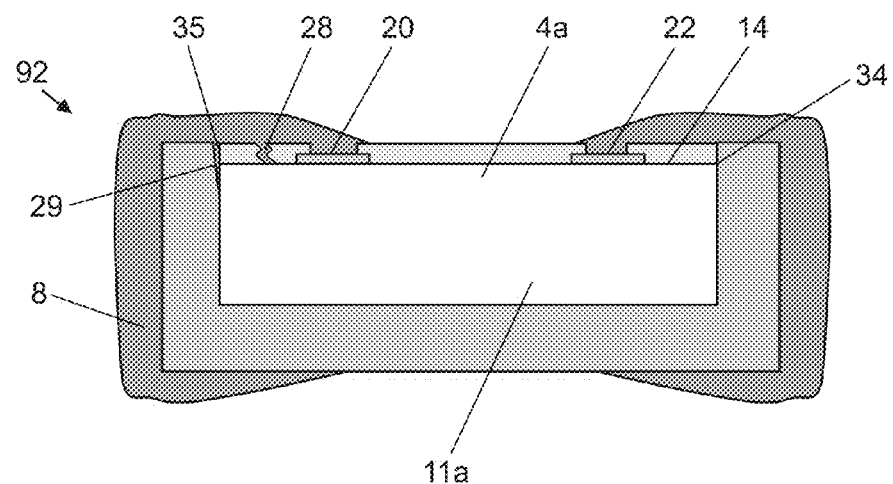
FIG. 3 shows in cross section possible failure modes of a packaged semiconductor product that is not according to the invention.

FIG. 3 shows in cross section possible failure modes of a packaged semiconductor product 92 that is not according to the invention, having the protective envelope 6, the first and second external electrode 8, 10, and the first semiconductor device 4A. FIG. 3 shows the crack 28, and an example of delamination 35. In FIG. 3, the protective envelope 6 does not extend between the first passivation layer 12A and the first external electrode 8 towards the first contact region 20. In addition, in FIG. 3 the protective envelope 6 does not extend between the first passivation layer 12A and the second external electrode 10 towards the second contact region 22. As a result, if the crack 28 develops, for example the first external electrode 8 may come into undesired electrical contact with the first substrate 11A. This can give rise to an unwanted electrical short.

Figure 4B:
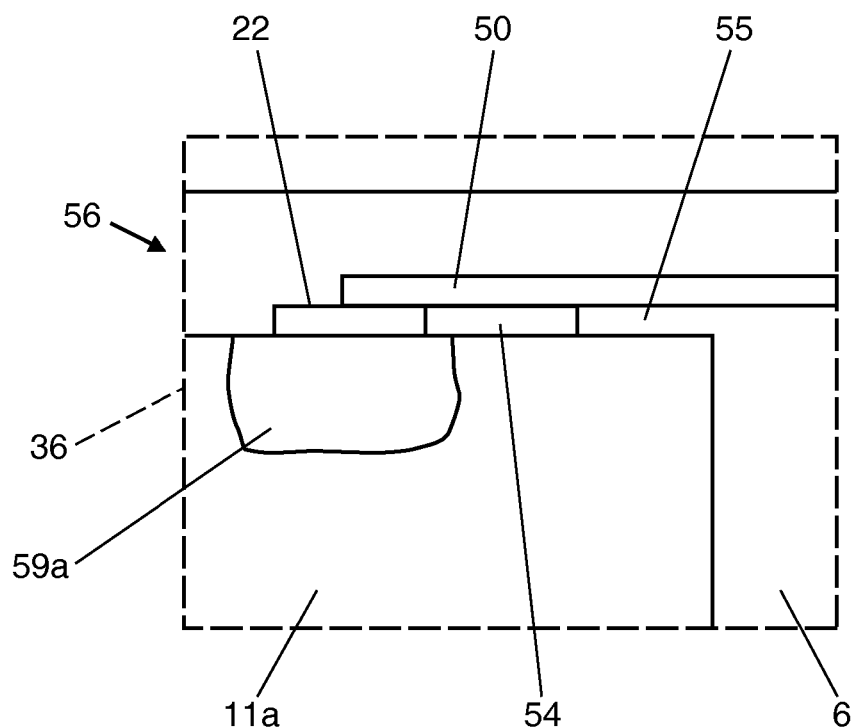
FIG. 4B shows an enlarged view of a detail of FIG. 4A.

FIG. 4A shows a cross section of the packaged semiconductor product 2 in a third embodiment according to the invention. FIG. 4B shows an enlarged view of a detail 36 of FIG. 4A. The packaged semiconductor product 2 in the third embodiment includes the first semiconductor device 4A, the protective envelope 6, the first external electrode 8 and the second external electrode 10. In the third embodiment, the protective envelope 6 extends between the first passivation layer 12A and the first external electrode 8 towards the first contact region 20. The first semiconductor device 4A includes the first passive component, indicated by a first dashed boundary 38A.

In addition, the packaged semiconductor product 2 in the third embodiment includes a second semiconductor device 4B having a second substrate 11B and is provided with a second passivation layer 12B and a second passive component, indicated by a second dashed boundary 38B. The second substrate 11B has a third main surface 40 and may have a fourth main surface 42 opposite to the third main surface 40. The second substrate 11B may further have a third side surface 44 and possibly second additional side surfaces 45 that extend from the third main surface 40 to the fourth main surface 42. The second substrate 11B may have substantially the shape of a rectangular box. The second passive component 38B is located along the third main surface 40 and has a third contact region 46 and a fourth contact region 48 for electrically contacting the second passive component 38B. The second electronic structure 38B is integrated with the second substrate 11B along the third main surface 40. Such integration in general includes that material of the second substrate 11B may be part of the second electronic structure 38B. The second passivation layer 12B substantially covers the third main surface 40 and the second passive component 38B and leaves free the third and fourth contact regions 46, 48, so that these can be contacted.

The protective envelope 6 may extend along the fourth main surface 42, the third side surface 44 and the second additional side surfaces 45 of the second semiconductor device 4B, and may be closely mechanically connected therewith. Hence, the second substrate 11B is embedded in the protective envelope 6 and the third main surface faces a second opening 49 of the protective envelope 6. The second external electrode 10 is electrically coupled to the second contact region 22 via the fourth contact region 48, the second passive component 38B, the third contact region 46, and a conducting structure 50 from the third contact region 46 to the second contact region 22.

In particular, the second external electrode 10 is coupled to the fourth contact region 48, for example via a second electrically conductive path outside the second passive component 38B. In the third embodiment, this is established by direct contact of the second external electrode 10 with the fourth contact region 48. In addition, the protective envelope 6 may extend between the second passivation layer 12B and the second external electrode 10 towards the fourth contact region 48.

In the third embodiment, the protective envelope 6 forms an isolating structure between the first substrate 11A of the first semiconductor device 4A and a second substrate 11B of the second semiconductor device 4B, the second substrate 11B being separate from the first substrate 11A. This promotes a good electrical isolation between the first semiconductor device 4A and the second semiconductor device 4B. In addition, an isolating layer portion 54 may extend between the conducting structure 50 and the first and/or second passivation layer so that the conducting structure 50 and the first and/or second passivation layer are electrically isolated. In general, the isolating layer portion 54 may be formed by a redistribution layer 56. Such a redistribution layer 56 offers the possibility of spatial rerouting of one or more of the first, second, third, and fourth contact regions 20, 22, 46, 48. Rerouting in this example is achieved by the first and second external electrode 8, 10, that may include solder bumps 58 for contacting for example the printed circuit board. In this way more space can be made available for contacting the packaged semiconductor product 2 to the printed circuit board, and a total number of the external electrodes can be increased. Part of the isolating layer portion 54 may be formed by a third extension 55 of the protective envelope 6 that extends between the first passivation layer 12A and the conducting structure 50 towards the second contact region 22, and/or by a fourth extension 57 of the protective envelope 6 that extends between the second passivation layer 12B and the conducting structure 50 towards the third contact region 46. The third and fourth extension 55, 57 of the protective envelope 6 can define a size of the second opening 49.

The isolating layer portion 54 may be arranged to extend between substantially all of the conducting structure 50 and the first substrate 11A and between substantially all of the conducting structure 50 and the second substrate 11B. In this way, direct contact between the conducting structure 50 and the first and second passivation layer 12A, 12B is substantially prevented.

Figure 4C:
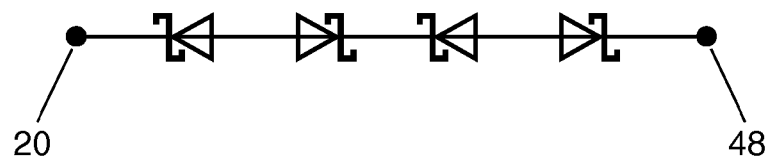
FIG. 4C shows an electric scheme of a back-to-back pair of Zener diodes or a back-to-back pair of Avalanche diodes.

In the third embodiment, the first and second passive components 38A, 38B may each include a back-to-back pair of Zener diodes or a back-to-back pair of Avalanche diodes. FIG. 4C shows an electric scheme of the back-to-back pair of Zener diodes or the back-to-back pair of Avalanche diodes. These can be obtained by p-doping the bulk of the first and second substrate 11A, 11B, which may both be made of silicon, and n-doping a pair of first substrate regions 59A and a pair of second substrate regions 59B. The first substrate regions 59A are mutually separated by the p-doped first substrate 11A and are each electrically connected to one of the first and second contact region 20, 22. The second substrate regions 59B are mutually separated by the p-doped second substrate 11B and are each electrically connected to one of the third and fourth contact region 46, 48.

In general, the packaged semiconductor product 2 can be a surface mount device (SMD) or a flip-chip device. The size of the SMD may be according to one of a group of standard sizes referred to as 01005, 0201, 0402, 0603, and 0805.

In the first, second, and third embodiment, the protective envelope 6 may be made of an epoxy material. In general, a thickness of the first, second, third, and fourth extension 26, 27, 55, 57 of the protective envelope 6 may be in a range from 1 to 15 micrometer. The protective envelope 6, here the first extension 26 of the protective envelope 6, may extend between the first passivation layer 12A and the first external electrode 8 towards the first contact region 20 over a distance in a range from 5 to 60 micrometer. The first and second passivation layer 12A, B may be deposited by a blanket deposition technique, such as chemical vapour deposition, have a thickness in a range from 0.5 to 1 micrometer, and be substantially made out of silicon nitride. Alternatively, plasma-enhanced chemical vapour deposition can be used as blanket deposition technique. Applying a curable dielectric that contains polyimide, benzocyclobutene (BCB) or an epoxy-based photoresist are other alternatives for applying the first and second passivation layer 12A, 12B, with a possible thickness ranging from 0.5 to 10 micrometer. By photolithographic patterning and subsequent etching of the first and second passivation layer 12A, 12B after blanket deposition, the first and second contact regions can be left free of the first passivation layer 12A, and the third and fourth contact regions can be left free of the second passivation layer 12B.

In the first and second embodiment, the first and second external electrodes 8, 10 may be made of a metal, for example nickel that is applied by electroless deposition. A layer thickness of the first and second external electrode 8, 10 may be in a range from 5 to 40 micrometer and may typically be 20 micrometer. The first and second external electrode made of nickel may be provided with a thin gold coating of typically about 0.5 micrometer thickness. Aluminium and/or copper may be used as well as a material of the first and second external electrode 8, 10, for example when the first and second external electrode are included by the redistribution layer 56.

In the third embodiment, the conducting structure 50, the redistribution layer 56, and the first and second external electrode may be deposited by known blanket deposition techniques, such as spin coating and sputtering, and patterned using known photolithographic patterning and etching techniques. The redistribution layer 56 may have a layer thickness in a range from 2 to 20 micrometer. The isolating layer portion 54, that may be included by the redistribution layer 56, may be substantially made out of polyimide, being an electrical isolator. The first and second contact region 20, 22 may be made out of metals and comprise aluminium and/or copper.

FIGS. 5A-D illustrate a first embodiment of a method for manufacture of the packaged semiconductor product 2 according to the invention, hereinafter referred to as the first method. The first method will be illustrated for the packaged semiconductor product 2 in the first embodiment. However, it may be used for manufacture of other packaged semiconductor products as well. In addition, the first method will be illustrated for a plurality of first semiconductor devices 4A for obtaining a plurality of packaged semiconductor products 2. However, the first method may also be used for obtaining a single packaged semiconductor product 2, possibly using a single first semiconductor device 4A.

The first method includes integrating the first electronic structures with the first substrates 11A of the plurality of first semiconductor devices 4A along the first main surfaces, which step as such is known to the person skilled in the art. Afterwards, first substrates are provided with the first passivation layer 12A, which substantially covers the first main surfaces 11A and the first electronic structures and leaves free the first and second contact regions.

Figure 5A:
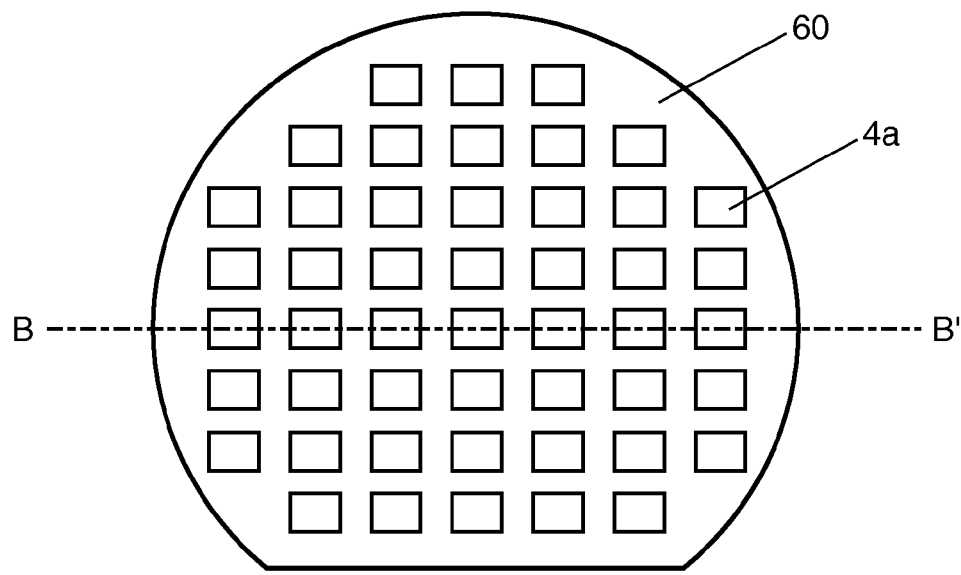
FIG. 5A shows a top view of a plurality of first semiconductor devices after they have been placed on a carrier according to a first method.
Figure 5B:
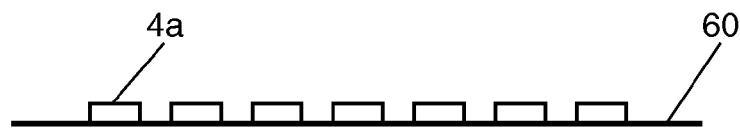
FIG. 5B shows a carrier in cross section along line B-B' in FIG. 5A, on which a plurality of first semiconductor devices are placed according to a first method.

FIG. 5A shows a top view of the plurality of first semiconductor devices 4A after they have been placed on the carrier 60 according to the first method. The plurality of first semiconductor devices 4A is placed on one and the same carrier 60, so that the carrier 60 is common for the plurality of first semiconductor devices 4A. Placing the plurality of first semiconductor devices 4A on the carrier 60 can for example be carried out using a pick and place machine. FIG. 5B shows the carrier 60 in cross section along line B-B' in FIG. 5A, on which the plurality of first semiconductor devices 4A are placed according to the first method.

The first method may include moulding the protective envelopes 6 around the plurality of first semiconductor devices 4A along the second main surfaces 16, the first side surface 18, the first additional side surfaces 19, and along a part of the first passivation layers 11A. As a result, the protective envelopes 6 extends along and possibly covers the second main surfaces 16, the first side surface 18, the first additional side surfaces 19, and the part of the first passivation layers. Hence, the first substrates 11A are embedded in the protective envelopes 6 and the first main surfaces 14 face first openings of the protective envelopes 6.

In general, moulding can be achieved by pouring or dispensing a precursor material over the first semiconductor devices 4A while they rest on the carrier 60, followed by curing the precursor material. Before curing, unwanted air inclusions may be removed, for example by using ultrasonics and/or vacuum. After curing, the precursor material is transformed into a common moulded structure 6, that forms the protective envelopes 6 of the plurality of first semiconductor devices 4A. Curing can for example include heating the precursor material using an oven or a hot plate, or illuminating the precursor material with ultraviolet radiation.

Figure 5C:
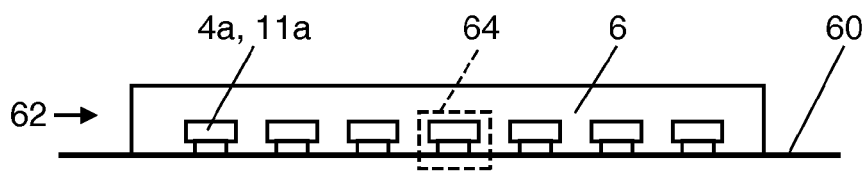
FIG. 5C shows semiconductor devices and a common moulded structure.

FIG. 5C shows the semiconductor devices 4A and the common moulded structure 6. A moulded wafer 62 is obtained after moulding that includes the plurality of first semiconductor devices 4A and the common moulded structure 6. An enlarged view of a detail 64 of the moulded wafer 62 will be further illustrated in FIG. 5D.

Figure 5D:
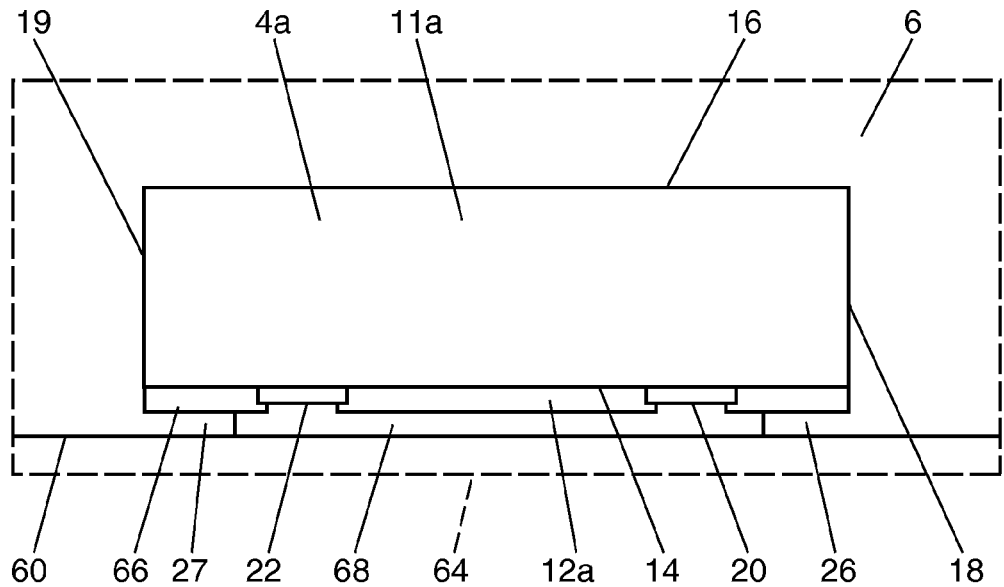
FIG. 5D shows an enlarged view of a detail of a moulded wafer.

FIG. 5D shows the enlarged view of the detail 64 of the moulded wafer 62, showing the first semiconductor device 4A and the protective envelope 6 formed by the common moulded structure 6. After moulding and curing, the protective envelope 6 may cover the second main surface 16, the first side surface 18, the first additional side surfaces 19, and the part 66 of the first passivation layer 12A. This may be achieved by placing the first semiconductor device 4A on the carrier 60 with the first passivation layer 12A facing the carrier 60, and partly filling a space 68 between the first passivation layer 12A and the carrier 60. Partly filling the space may be performed by compression of the precursor material and by using a flexible carrier, so that the space becomes filled by underfilling the first semiconductor device by the precursor material. By such filling of the space 68, the first and second extension 26, 27 of the protective envelope 6 can be formed. Alternatively, the first and second extension 26, 27 of the protective envelope 6 may be formed in other ways as well.

Figure 6:
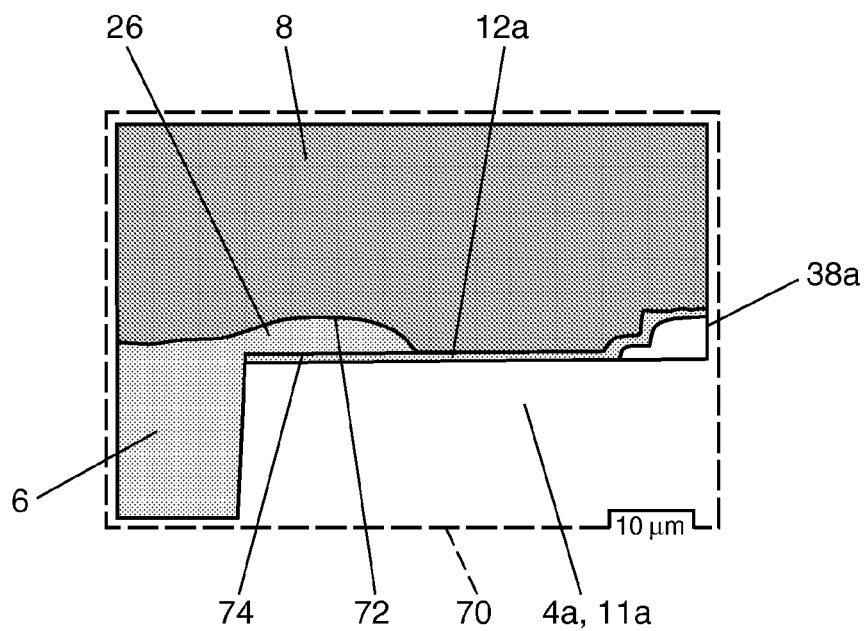
FIG. 6 shows in cross section an enlarged view of a detail, indicated in FIG. 1B, of a packaged semiconductor product in a first embodiment.

FIG. 6 shows in cross section an enlarged view of a detail 70, indicated in FIG. 1B, of the packaged semiconductor product 2 in the first embodiment. The first extension 26 of the protective envelope may typically have a curved interface 72 with the first external electrode 8, and have a substantially flat interface 74 with the first passivation layer 12A. Such a shape may be obtained by the filling of the space 68 when the packaged semiconductor product 2 is manufactured according to the first method.

The first method may further include the step of dividing the moulded wafer into separate packaged semiconductor products, each packaged semiconductor product including one or more semiconductor devices of the plurality of first semiconductor devices. In this way, separate packaged semiconductor products 2 can be obtained. Dividing the moulded wafer may be carried out by using a saw that offers a surface roughness of at least 0.5 micrometer (measured peak-to-peak over a lateral distance of at most ten micrometer), thus improving adhesion of the first and second external electrode 8, 10 to the protective envelope 6.

The first method further includes applying the first and second external electrode 8, 10 for each of the plurality of packaged semiconductor products. The first and second external electrode cover the part of the protective envelope 6 and may be applied in direct electrical contact with respectively the first contact region 20 and the second contact region 22. In the first method, the first and second external electrode 8, 10 are applied by electroless deposition of nickel. The term 'direct electrical contact' is to be understood, in the context of the present application, as a connection of the external electrode 10 and the contact region 22 without any further interconnect extending between both of them. The term 'direct electrical contact' does not exclude the presence of an additional metallisation and/or adhesion layer on top of the contact region 22.

Thus, in a second embodiment of a method according to the invention (hereinafter referred to as the second method), the first and second external electrode are part of the redistribution layer and, in addition, may include solder bumps and possibly under-bump metallisation layer portions.

The first and second method may include separating the first semiconductor device 4A from a semiconductor wafer by sawing along the first side surface 18 of the first substrate 11A using a saw with a first thickness creating a notch in the semiconductor wafer and sawing along the notch using a saw with a second thickness. The second thickness is smaller than the first thickness. The first saw may reach to a depth in a range from 10% to 40% of a total thickness D (FIG. 2) of the first substrate 11A, while the second saw may reach through the whole thickness D of the semiconductor wafer. In this way, the first side surface 18 is obtained that is provided with the recess 32 having a surface that extends between a first edge 29 and a second edge 34.

In general, the thickness D (FIG. 2) of the first and/or second substrate may be in a range from 50 to 300 micrometer. In general, a depth of the recess 32 in a direction parallel with the first main surface may be in a range from 2 to 30 micrometer.

The packaged semiconductor product 2 in the second embodiment can also be applied in a modified state separate from the invention, wherein the protective envelope 6 does not extend between the first passivation layer 12A and the first external electrode 8 towards the first contact region 20 and/or between the first passivation layer 12A and the second external electrode 10 towards the second contact region 22. As a result, the first passivation layer 12A may be substantially free of the protective envelope 6. Such a packaged semiconductor product meets the objective of having an improved electrical isolation of the first substrate 11A and has an improved protection against occurrence of unwanted shorts through the first substrate 11A, possibly independent of coating failure.

The packaged semiconductor product 2 in the third embodiment can also be applied in a modified state separate from the invention, wherein the protective envelope 6 does not extend between the first passivation layer 12A and the first external electrode 8 towards the first contact region 20 and/or between the second passivation layer 12B and the second external electrode 10 towards the fourth contact region 48, and/or does not extend between the first and second passivation layer 12A, 12B and the conducting structure 50 towards respectively the second and third contact region 22, 46. As a result, the first and/or second passivation layer may be substantially free of the protective envelope 6. Such a packaged semiconductor product 2 meets the objective of having an improved electrical isolation, in this case for example between the first and second substrate 11A, 11B, and has an improved protection against occurrence of unwanted shorts between the first and second substrate 11A, 11B, possibly independent of coating failure.

The invention is not limited to any embodiment herein described and, within the purview of the skilled person, modifications are possible which may be considered within the scope of the appended claims. Equally all kinematic inversions are considered inherently disclosed and to be within the scope of the present invention. The use of expressions like: "preferably", "in particular", "more in particular", "typically", etc. is not intended to limit the invention. The indefinite article "a" or "an" does not exclude a plurality. Features which are not specifically or explicitly described or claimed may be additionally included in the structure according to the present invention without deviating from its scope.

Specifically, while the application refers to an interface between the semiconductor substrate and the passivation layer, it is not excluded that one or more layers may be present in between of both. Such interface is then any interface that has come into existence as a result of a deposition step. Moreover, while it is relatively common that a passive discrete component has merely two U-shaped external electrodes extending each covering a side surface, there is no strict need thereto. The packaged device of the invention may have more than two external electrodes and more than a single external electrode may extend on a particular side surface. Furthermore, though the embodiment with U-shaped external electrodes is preferred, the invention may also be applied with advantage for other fan-out packages. In such fan-out packages, the external electrodes generally are present at the same side as the passivation layer.

The invention claimed is:

1. Packaged semiconductor product including
a first semiconductor device and a packaging structure with
a protective envelope and a first and a second external electrode,
the first semiconductor device having a first substrate and being provided with a first passivation layer and a first electronic structure,
wherein the first substrate is embedded in the protective envelope and has a first main surface that faces a first opening of the protective envelope, the first electronic structure being integrated with the first substrate along the first main surface and having a first and a second contact region,
wherein the first passivation layer substantially covers the first main surface and the first electronic structure and leaves free the first and second contact region,
wherein the first external electrode is electrically coupled to the first contact region and the second external electrode is electrically coupled to the second contact region,
and the protective envelope extends between the first passivation layer and the first external electrode towards the first contact region,
wherein a recess is provided in the first main surface of the first substrate adjacent to the first side surface, the recess being filled and engaged by the protective envelope, wherein the protective envelope comprises a material with a higher elasticity than the first substrate and the first passivation layer, wherein the first passivation layer is made of a dielectric that contains polyimide, benzocyclobutene (BCB) or an epoxy-based photoresist material, and wherein the first and second external electrodes include solder bumps.

2. Packaged semiconductor product according to claim 1, wherein the first external electrode is electrically coupled to the first contact region by direct contact therewith and/or the second external electrode is electrically coupled to the second contact region by direct contact therewith.

3. Packaged semiconductor product according to claim 1, wherein the protective envelope further extends between the first passivation layer and the second external electrode towards the second contact region.

4. Packaged semiconductor product according to claim 1, wherein the first substrate further has a second main surface opposite to the first main surface, and a first side surface that extends from the first main surface to the second main surface, wherein the protective envelope extends along the second main surface and/or the first side surface, wherein the first external electrode covers a part of the protective envelope adjacent to at least one of the first main surface, the second main surface, and/or the first side surface.

5. Packaged semiconductor product according to claim 4, wherein the recess is present at an intersection of the first side surface and a further, second side surface.

6. Packaged semiconductor product according to claim 1, including
a second semiconductor device having a second substrate and being provided with a second passivation layer and a second electronic structure,
wherein the second substrate is embedded in the protective envelope and has a third main surface that faces a second opening of the protective envelope, the second electronic structure being integrated with the second substrate along the third main surface and having a third and a fourth contact region,
wherein the second passivation layer substantially covers the third main surface and the second electronic structure and leaves free the third and fourth contact region,
wherein the second external electrode is electrically coupled to the fourth contact region and is electrically connected to the second contact region via the fourth contact region, the second electronic structure, the third contact region, and a conducting structure from the third contact region to the second contact region,
wherein the protective envelope forms an isolating structure between the first substrate and the second substrate.

7. Packaged semiconductor product according to claim 6, wherein an isolating layer portion extends between the conducting structure and the first and/or second passivation layer.

8. Packaged semiconductor product according to claim 7, wherein the isolating layer portion is arranged to extend between substantially all of the conducting structure and the first substrate and/or between substantially all of the conducting structure and the second substrate.

9. Packaged semiconductor product according to claim 7, wherein at least part of the isolating layer portion is formed by an extension of the protective envelope that extends between the first passivation layer and the conducting structure towards the second contact region and/or that extends between the second passivation layer and the conducting structure towards the third contact region.

10. Packaged semiconductor product according to claim 6, wherein the second external electrode is electrically coupled to the fourth contact region by direct contact therewith, wherein the protective envelope extends between the second passivation layer and the second external electrode towards the fourth contact region.

11. Packaged semiconductor product according to claim 1, wherein the first and/or second electronic structure includes at least one of a passive component, a structure for combined passive functions, and an integrated circuit structure.

12. Electric product including a packaged semiconductor product according to claim 1.

13. Method for manufacture of a packaged semiconductor product that includes a first semiconductor device and a packaging structure with a protective envelope and a first and second external electrode, the first semiconductor device having a first substrate that has a first main surface, including the steps of:
   a) integrating a first electronic structure with the first substrate along the first main surface, the first main surface having a recess therein, the first electronic structure having a first and a second contact region for electrically contacting the first electronic structure;
   b) providing the first substrate with a first passivation layer, which substantially covers the first main surface and the first electronic structure and leaves free the first and second contact region;
   c) placing the first semiconductor device on a carrier;
   d) moulding the protective envelope around the first semiconductor device, so that the first substrate is embedded in the protective envelope and the first main surface faces a first opening of the protective envelope, moulding the protective envelope along a part of the first passivation layer; and further moulding the protective envelope into the recess; and
   e) applying the first and second external electrode with the first external electrode coupled to the first contact region and the second external electrode electrically coupled to the second contact region, wherein the protective envelope comprises a material with a higher elasticity than the first substrate and the first passivation layer, wherein the first passivation layer is made of a dielectric that contains polyimide, benzocyclobutene (BCB) or an epoxy-based photoresist material, and wherein the first and second external electrodes include solder bumps.

14. Method according to claim 13, wherein step c) includes placing the first semiconductor device on a carrier with the first passivation layer facing the carrier, and step d) includes moulding the protective envelope around the first semiconductor device along the part of the first passivation layer by partly filling a space between the first passivation layer and the carrier.

15. Method according to claim 13, including carrying out the steps:
   a)-e) for a plurality of first semiconductor devices, wherein the carrier is common for the plurality of first semiconductor devices and the protective envelopes of the plurality of first semiconductor devices are formed by a common moulded structure, wherein a moulded wafer is obtained after steps a)-d) and possibly after step e) that includes the plurality of first semiconductor devices and the common moulded structure, including the step of:
   f) dividing the moulded wafer into separate packaged semiconductor products, each packaged semiconductor product including one or more semiconductor devices of the plurality of first semiconductor devices.

16. Method according to claim 13, the method including separating the first semiconductor device from a semiconductor wafer by sawing using a saw with a first thickness creating a notch in the semiconductor wafer and sawing along the notch using a saw with a second thickness that is smaller than the first thickness, thus obtaining a recess adjacent to the first side surface.

17. Method according to claim 13, wherein step e) includes applying the first external electrode in direct electrical contact with the first contact region and/or applying the second external electrode in direct electrical contact with the second contact region.

* * * * *